(12) United States Patent
Klee et al.

(10) Patent No.: US 11,984,743 B2
(45) Date of Patent: May 14, 2024

(54) BATTERY PACK AND CHARGING METHOD FOR A BATTERY PACK

(71) Applicant: Robert Bosch GmbH, Stuttgart (DE)

(72) Inventors: Christoph Klee, Stuttgart (DE);
Juergen Mack, Goeppingen (DE);
Mickael Segret, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 613 days.

(21) Appl. No.: 17/266,519

(22) PCT Filed: Jul. 12, 2019

(86) PCT No.: PCT/EP2019/068820
§ 371 (c)(1),
(2) Date: Feb. 5, 2021

(87) PCT Pub. No.: WO2020/043386
PCT Pub. Date: Mar. 5, 2020

(65) Prior Publication Data
US 2021/0296918 A1    Sep. 23, 2021

(30) Foreign Application Priority Data

Aug. 29, 2018 (DE) .......................... 102018214609.8

(51) Int. Cl.
*H02J 7/00* (2006.01)
*G01R 31/3835* (2019.01)
(Continued)

(52) U.S. Cl.
CPC ........ *H02J 7/0047* (2013.01); *G01R 31/3835* (2019.01); *G01R 31/392* (2019.01);
(Continued)

(58) Field of Classification Search
CPC . H02J 7/0047; G01R 31/3835; G01R 31/392; G01R 31/396; G01R 31/2843;
(Continued)

(56) References Cited

U.S. PATENT DOCUMENTS 8,797,043 B2    8/2014  Laber et al.
2011/0156714 A1  6/2011  Mizoguchi et al.
(Continued)

FOREIGN PATENT DOCUMENTS

DE    102012201381 A1    8/2012
DE    102013220684 A1    4/2015
(Continued)

OTHER PUBLICATIONS

International Search Report for PCT/EP2019/068820, dated Aug. 14, 2019.

*Primary Examiner* — Paul Dinh
(74) *Attorney, Agent, or Firm* — NORTON ROSE FULBRIGHT US LLP; Gerard A. Messina (57) ABSTRACT

A battery pack having a specified number of battery cells connected to one another and having a monitoring unit, in particular of the type of an SCM circuit, for the individual battery cells. The monitoring unit has a passive input circuit, and is designed to recognize various electrical faults within the passive input circuit using a time measuring unit allocated to the monitoring unit, in particular on the basis of a measurement of rise times of a voltage.

31 Claims, 4 Drawing Sheets

(51) Int. Cl.
  *G01R 31/392* (2019.01)
  *G01R 31/396* (2019.01)
  *H01M 10/42* (2006.01)
  *H01M 10/44* (2006.01)
  *H01M 10/48* (2006.01)

(52) U.S. Cl.
  CPC ...... *G01R 31/396* (2019.01); *H01M 10/4257* (2013.01); *H01M 10/441* (2013.01); *H01M 10/48* (2013.01); *H01M 2010/4271* (2013.01)

(58) Field of Classification Search
  CPC ...... G01R 31/389; G01R 35/00; G01R 19/12; H01M 10/4257; H01M 10/441; H01M 10/48; H01M 2010/4271; Y02E 60/10
  USPC ........................................................ 320/161
  See application file for complete search history.

(56) References Cited

U.S. PATENT DOCUMENTS

2013/0200850 A1    8/2013  Ke
2014/0292345 A1*  10/2014  Matumoto ............ H02J 7/0016
                                                                    324/434

FOREIGN PATENT DOCUMENTS

DE   102015219823 A1   4/2017
JP       2007285714 A  11/2007
JP       2012185051 A   9/2012
JP       2016223797 A  12/2016

* cited by examiner

BATTERY PACK AND CHARGING METHOD FOR A BATTERY PACK

FIELD

The present invention relates to a battery pack having a specified number of individual battery cells connected to one another and having a monitoring unit, in particular of the type of an SCM circuit (Single Cell Monitoring circuit) for the individual battery cells, the monitoring unit having a passive input circuit.

BACKGROUND INFORMATION

A battery pack having a specified number of individual battery cells connected to one another and having a monitoring unit is available in the related art. Here, the monitoring unit is realized as an SCM circuit for the individual battery cells, and has a passive input circuit.

In such a battery pack, a plurality of battery cells are standardly connected electrically to one another in series and/or in parallel in order to achieve higher electrical power levels. In order to achieve a particularly high energy density, lithium-ion batteries or lithium-polymer batteries are in particular used. In these battery technologies, it is necessary for each cell to be operated in a particular operating parameter range that is defined by voltage, current, and temperature. In order to ensure that this operating parameter range is always met for each individual battery cell of the battery pack, the voltages of the individual battery cells are continuously monitored, e.g., using the so-called single cell monitoring (SCM) method. Using the SCM method, it is ensured that, above all during charging, no battery cell is operated above its permissible charging end voltage, or target voltage. For the SCM method, it is necessary that electrical signals of connection points between two battery cells connected in series be forwarded to the monitoring unit.

A realization of the SCM method takes place, e.g., using a so-called SCM circuit, such as for example the integrated circuit Texas Instruments® BQ771800, or a combination of a microcontroller and a so-called passive front end or an input circuit. The electrical connection between the battery cell connection points and the SCM circuit is typically monitored using a so-called "open wire detection." In this context, switches are briefly activated one after the other that at least briefly bridge the voltage measurement inputs of the SCM circuit. As a result, a respectively allocated filter capacitor is briefly discharged in a defined fashion. Subsequently, the relevant switch is opened again. After a short time, the voltage at the briefly bridged voltage measurement input of the SCM circuit is again checked. If an "open wire" is present, the capacitor would not yet have been recharged, which can be detected by the SCM circuit. So that the SCM circuit reliably limits the charging end voltage even when there are individual electrical faults in the input circuit, it is in addition necessary to design the relevant circuit parts to be secure against individual faults. However, this requires a complex, redundant design of the relevant circuit parts. The redundancy of the input circuit of the SCM circuit is in addition problematic because the electrical signals of the individual branches of the battery cells require special insulation protection in this regard; i.e., in case of error they can cause high currents and/or voltages that can cause resulting thermal faults. In addition, electrical faults can occur in the input circuit of an SCM circuit that are not detectable by the conventional open wire detection.

SUMMARY

The present invention relates to a battery pack having a specified number of individual battery cells wired to one another and a monitoring unit, in particular of the type of an SCM circuit, for the individual battery cells, the monitoring unit having a passive input circuit. The monitoring unit is designed to recognize various electrical faults inside the passive input circuit, using a time measurement unit assigned to the monitoring unit, in particular on the basis of a measurement of rise times of a voltage.

The present invention, thus, makes it possible to continuously monitor the passive input circuit of the monitoring unit for the presence of various electrical faults. A redundant design of the passive input circuit, which would otherwise be necessary for safety reasons, can be omitted. All the functionalities of the monitoring unit are preferably realized with an integrated digital microcontroller.

Preferably, the monitoring unit has at least one voltage measuring device for acquiring the voltages, as well as electronic switches. As a result, an individual monitoring of each individual battery cell of the battery pack is possible. For each battery cell, an individual voltage measuring device, in particular an analog-digital converter, can be provided inside the monitoring unit or the microcontroller. Alternatively, a temporally offset measurement of the individual voltages can take place using only one voltage measuring device and a multi-channel analog multiplexer connected upstream therefrom.

Preferably, the passive input circuit has a plurality of resistors and capacitors. In this way, temporal rise curves of the voltage can be produced.

According to an advantageous development of the present invention, the electrical faults inside the passive input circuit are each recognizable through an absolute and/or relative evaluation of rise times of a voltage, through the at least brief bridging respectively of one of the voltage measuring devices of the monitoring unit, using an allocated switch. As a result, the fault recognition is based on an evaluation of the rise times, and not on an acquisition of absolute voltage values, so that the error recognition is independent of individual properties of the battery pack, such as aging effects, a charge state of individual battery cells, and currently flowing charge or discharge currents.

Preferably, the passive input circuit has a plurality of additional resistors that are each connected in series with one of the resistors, the number of additional resistors being equal to the specified number of battery cells. In this way, a recognition of the electrical faults via the evaluation of a falling voltage curve is possible. In addition, in this way mutually compensating faults can also be recognized that can occur if for example a resistance value rises as the result of a fault, and a capacitance of the associated capacitor correspondingly fall off as the result of a fault, so that the product of the resistance value and the capacitance externally remains substantially unchanged.

Preferably, the additional resistors are made smaller than or equal to the resistors. In this way, the recognition of the electrical faults can be further improved. The fault detection is realized particularly advantageously if the additional resistors have a resistance value between 20% and 80% of the resistance value of the resistors.

In a development of the present invention, it is provided that the monitoring unit is realized as an integrated circuit.

As a result, a particularly space-saving integration in existing battery pack designs is possible.

In addition, the present invention relates to a method for acquiring electrical faults in a passive input circuit of a monitoring unit, in particular of the type of an SCM circuit, for a specified number of individual battery cells of a battery pack, in particular a battery pack as described above. In accordance with an example embodiment of the present invention, the method includes the following steps:

a) start of a charging operation of the battery pack,
  b) measurement of a voltage,
  c) at least brief bridging of a voltage measuring device of the monitoring unit using an allocated switch,
  d) measurement of a rise time until a currently measured voltage has reached a fraction of from 0.1 to 0.9 of the voltage,
  e) repetition of steps b) through d) for each of the specified number of battery cells of the battery pack,
  f) absolute and/or relative evaluation of the rise times on the basis of a specified tolerance range, and
  g) stopping the charging operation of the battery pack if at least one rise time is outside the tolerance range, so that a fault was recognized in the passive input circuit of the monitoring unit; otherwise continuation of the charging operation and cyclical repetition of steps b) through g).

The example method enables a continuous monitoring of the input circuit for the presence of possible electrical faults. A cycle time for a complete run-through of the method can last for example up to one second.

Preferably, when the specified number is equal to one, the rise time is corrected by a temporal correction factor if the first voltage measuring device is not connected, via an electrical resistor, to a minus pole of the battery pack. Here, preferably given a cell whose input filter differs from the input filter of other cells, the rise time is corrected by a temporal correction factor. In this way, an electrical asymmetry, caused by the faulty resistor, of the passive input circuit of the monitoring unit can easily be numerically compensated.

BRIEF DESCRIPTION OF THE DRAWINGS

The present invention is explained in more detail below on the basis of exemplary embodiments shown in the figures.

DETAILED DESCRIPTION OF EXAMPLE EMBODIMENTS

Figure 1:
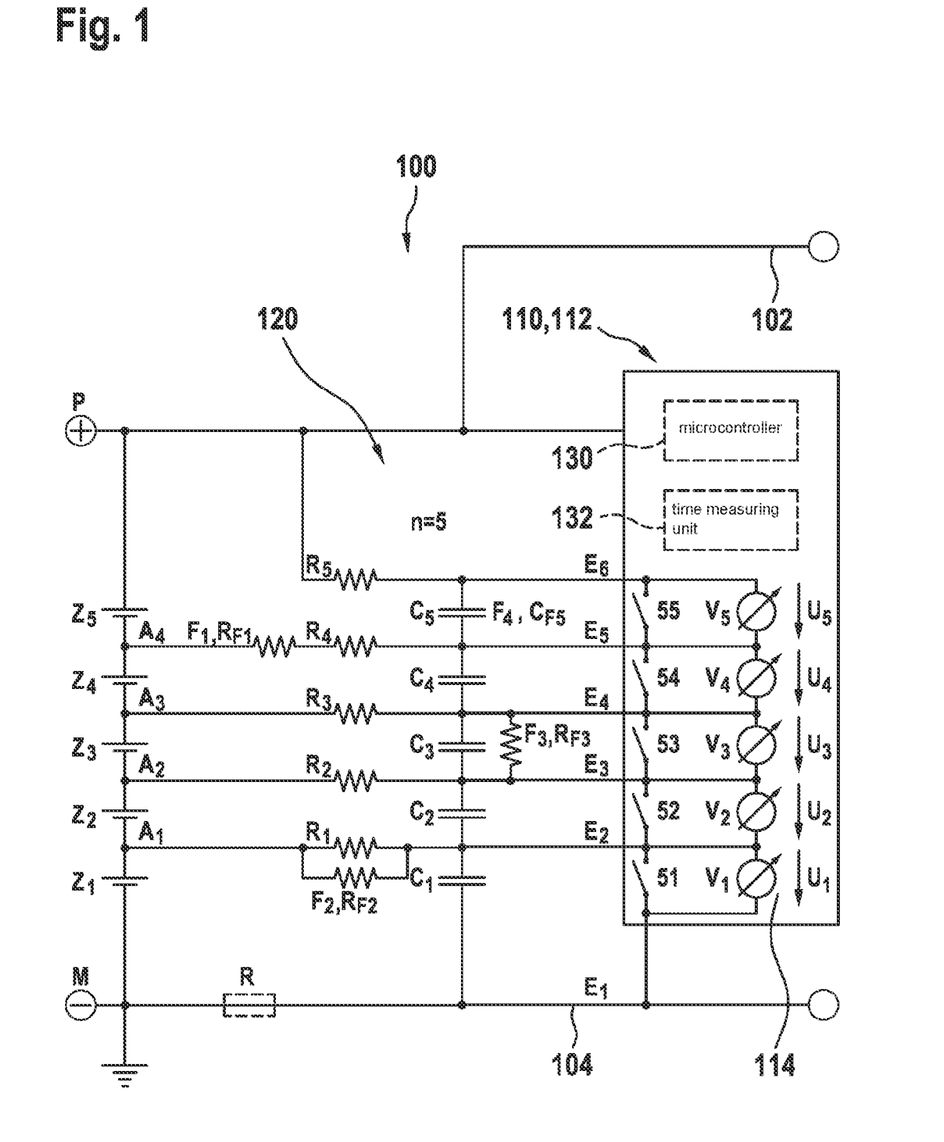
FIG. 1 shows a battery pack according to an example embodiment of the present invention having a monitoring unit and having an input circuit for monitoring individual battery cells.

FIG. 1 shows a battery pack 100, here having, merely as an example, a number of n equal to five (n=5) battery cells connected, only as an example, in series. Alternatively, battery cells $Z_1, \ldots, _5$ can be connected, for voltage and current adaptation, in series or in parallel as desired. Between each two battery cells $Z_1, \ldots, _5$ connected in series, there is a respective (center) tap $A_1, \ldots, _4$. Battery pack 100 has a minus pole M, or a ground branch and a plus pole P, the minus pole M being connected to the minus pole of battery cell $Z_1$ and the plus pole P being connected to the plus pole of battery cell $Z_5$ identically. An arbitrary electrical consumer (not shown) can be connected to the minus pole M, or to the ground branch and to the plus pole P, using two electrical connecting lines 102, 104.

In addition, battery pack 100 comprises an electronic monitoring unit 110 for the permanent monitoring of each individual battery cell $Z_1, \ldots, _5$ of battery pack 100, realized in particular as an SCM circuit 112, a passive input circuit 120 being connected before monitoring unit 110. In monitoring unit 110, a high-performance digital microcontroller 130 and a time measuring unit 132 are preferably additionally integrated. Monitoring unit 110 is preferably realized as an integrated monolithic circuit 114.

Figure 2:
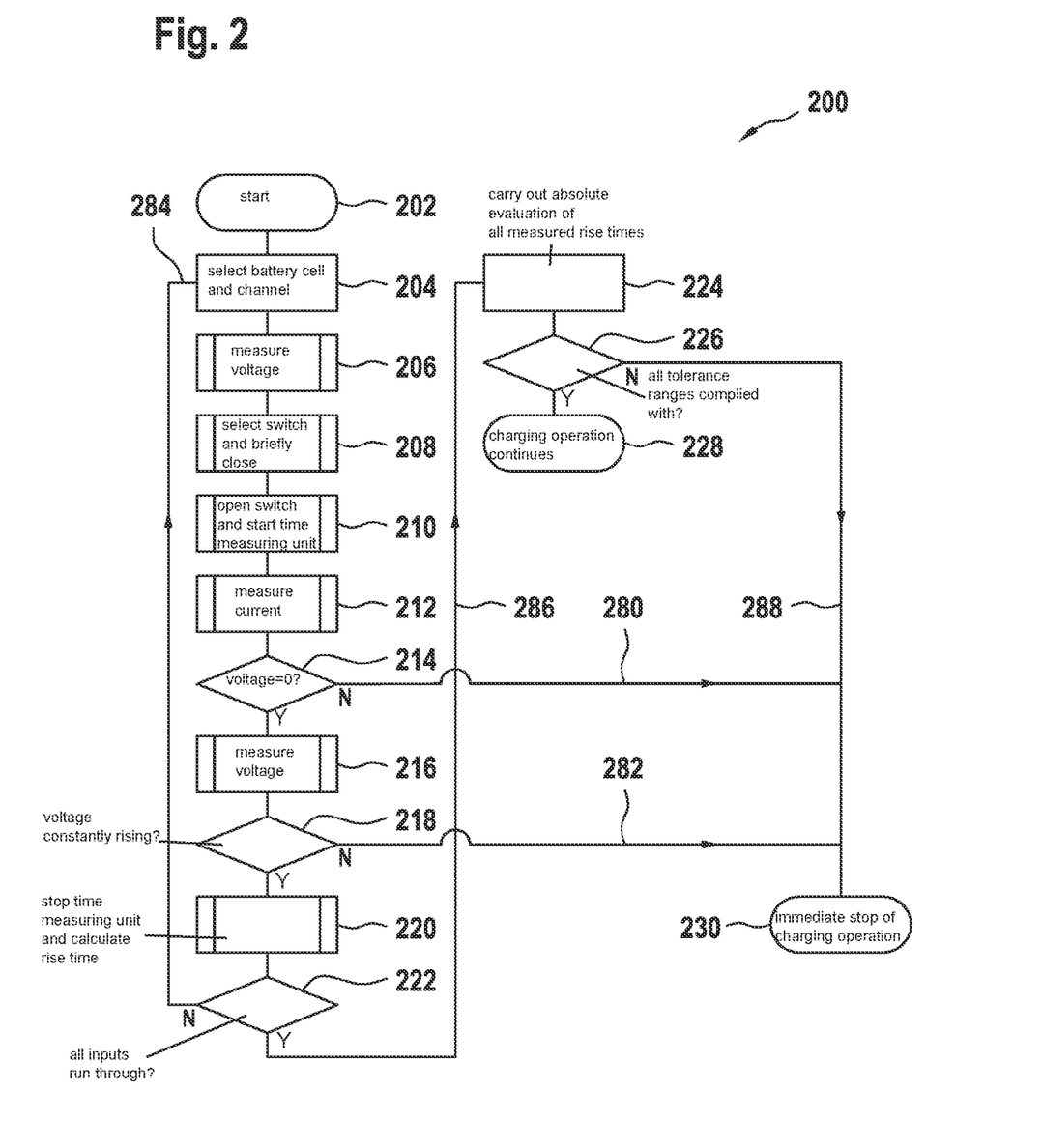
FIG. 2 shows a schematic view of an algorithm for recognizing electrical faults in the input circuit of the monitoring unit of the battery pack of FIG. 1, using the monitoring unit, in accordance with an example embodiment of the present invention.

Preferably, passive input circuit 120 has a plurality of resistors $R_1, \ldots, _n$ and capacitors $C_1, \ldots, _n$. Input circuit 120 of monitoring unit 110 here includes the number n equal to five (n=5), likewise corresponding to five resistors $R_1, \ldots, _5$, the resistors $R_1, \ldots, _4$ each being configured in series behind taps $A_1, \ldots, _4$ of the individual battery cells $Z_1, \ldots, _5$. However, resistor $R_5$ is connected directly to plus pole P, or the plus pole of battery cell $Z_5$. In addition, the input circuit contains, as an illustration, five capacitors $C_1, \ldots, _5$, each connected in parallel to two immediately adjacent inputs $E_1, \ldots, _6$ of monitoring unit 110. It is to be noted that monitoring unit 110 can also have more or fewer than five resistors $R_1, \ldots, _5$ and/or capacitors $C_1, \ldots, _5$. Thus, instead of a resistor, e.g. resistor $R_1$, a plurality of resistors may also be present that can be configured in series or in parallel to one another. Preferably, a resistor $R_1, \ldots, _5$ shown in FIG. 2 is formed by two resistors configured in series, whereby a correspondingly allocated insulation distance is increased. In addition, preferably the capacitors $C_1, \ldots, _5$ shown in FIG. 2 are realized as two capacitors configured in series, so that when there is mechanical damage to one of the two capacitors, a short-circuit cannot arise.

Monitoring unit 110 preferably has at least one voltage measuring device $V_1, \ldots, _n$ for acquiring voltages $U_1, \ldots, _n$. Between each two adjacent inputs $E_{1,2}, E_{2,3}, E_{3,4}, E_{4,5}$ and $E_{5,6}$ of monitoring unit 110, here in each case, as an example, a voltage measuring device $V_1, \ldots, _5$ is connected that in each case can be individually bridged, or short-circuited, using an electronic switch $S_1, \ldots, _5$ that can be actuated by the microcontroller. Voltage measuring units $V_1, \ldots, _5$ in monitoring unit 110 can be realized for example with electronic analog-digital converters (ADCs) of microcontroller 130. Instead of the five voltage measuring units $V_1, \ldots, _5$, shown here only as an example, it is also possible to provide only one voltage measuring unit to which the inputs $E_1, \ldots, _6$ can be connected temporally one after the other using an analog multiplexer (not shown), with connection of the electronic switches $S_1, \ldots, _5$. With the aid of the five voltage measuring units $V_1, \ldots, _5$, shown here only as an example, the (input) voltages $U_1, \ldots, _5$ can be acquired simultaneously if this is required, using monitoring unit 110.

Monitoring unit 110 is designed to acquire various electrical faults $F_1, \ldots, _4$, here shown as examples, inside passive input circuit 120, in particular on the basis of a measurement and an evaluation of a respective rise time $T_{An\ 1, \ldots, 5}$ of an algorithmically selected (input) voltage $U_1, \ldots, _n$ after an at least brief short-circuiting or bridging of one of the voltage measuring devices $V_1, \ldots _5$ using electronic switches $S_1, \ldots, _5$, with the aid of time measuring unit 132. Preferably, voltages $U_1, \ldots, _n$ are continuously measured in rotating fashion with a cycle time of less than one second, and the relevant rise times $T_{An\ 1}, \ldots, _5$ are correspondingly acquired by monitoring unit 110 and are evaluated absolutely and/or relatively on the basis of a tolerance range.

A first fault $F_1$ in the form of an additional series resistor $R_{F2}$, which can result for example from a poor solder joint, will at least detectably increase the rise times $T_{An\ 4,5}$ at the two inputs $E_{4,5}$ of monitoring unit 110. A second fault $F_2$ in the form of a parasitic parallel resistor $R_{F2}$, which could be caused for example by contamination of a circuit board (not shown) of input circuit 120, will at least detectably increase rise time $T_{An\ 1}$ at input $E_1$ of monitoring unit 110. A third fault $F_3$, in the form of a resistor $R_{F3}$ situated parallel to capacitor $C_3$, which can result for example from an insulation fault in some areas in the dielectric of capacitor $C_3$, will result at least in a measurable change in rise time $T_{An\ 3}$ of input $E_3$ of monitoring unit 110. A fourth fault $F_4$ in the form of a changed capacitance value $C_{F5}$, which can occur for example due to damage to the dielectric of capacitor $C_5$, will detectably influence rise time $T_{An\ 5}$ at least at input $E_5$ of monitoring unit 110.

According to the example method, preferably first an algorithmically selected voltage $U_1, \ldots, _5 (t_1)$ is ascertained immediately before an at least brief short-circuiting of one of the voltage measuring devices $V_1, \ldots, _5$ in a first time $t_1$. After an at least brief short-circuiting of the selected voltage measuring device $V_1, \ldots, _5$, the relevant current voltage $U_1, \ldots, _5 (t_2)$ preferably continues to be further measured until it has reached a fraction of between 0.1 and 0.9 of the relevant original voltage $U_1, \ldots, _5 (t_1)$, and has thus fulfilled a termination condition. Rise time $T_{An\ 1}, \ldots, _n$ of the relevant voltage $U_1, \ldots, _5$ then results from the difference between the two times $t_2$ and $t_1$. Here, second time $t_2$ results from the stopping of the time from first time $t_1$ up to the reaching of the termination condition. First and second times $t_1$, $t_2$ are preferably determined using time measuring unit 132, also controlled by microcontroller 130. The smaller the fraction acting as termination condition, the faster the fault recognition can take place. For medium-large fractions, the accuracy increases, while for large fractions the sensitivity becomes less. Preferably, therefore, the measurement of the relevant voltage $U_1, \ldots, _5 (t_2)$ is carried out with a fraction of 0.5 as termination condition. The four electrical faults $F_1, \ldots, _4$, given as examples in passive input circuit 120 are then capable of being acquired by an absolute and/or relative evaluation of the rise times $T_{An\ 1}, \ldots, _5$, ascertained in this way, of the relevant voltage $U_1, \ldots, _5$, on the basis of a tolerance range that is predefined in monitoring unit 110.

An advantage of monitoring unit 110 of battery pack 100 is that an evaluation of the relevant rise times $T_{An\ 1}, \ldots, _5$, and not of an absolute voltage value, takes place. On the one hand, in this way the tolerance ranges for the evaluation are independent of the respective charge state of the individual battery cells $Z_1, \ldots, _5$ of battery pack 100, and on the other hand there exist commercially available microcontrollers 130 with which for example a threshold value can be specified for an analog-digital converter, or a voltage measuring device $V_1, \ldots, _5$, and only the rise time $T_{An\ 1}, \ldots, _5$ until the specified threshold value is reached has to be measured. As a result of this circumstance, more resources of microcontroller 130 are available for other tasks. For rise time $T_{An\ 1}$, if warranted another correction factor is to be taken into account computationally if, as shown here, input $E_1$ is not connected via an electrical (compensating) resistor R within the ground branch, but rather is connected directly to minus pole M of battery pack 10.

FIG. 2 shows an example algorithm for recognizing electrical faults $F_1$-$F_4$ within input circuit 120 of monitoring unit 110 of battery pack 100 of FIG. 1, with the aid of monitoring unit 110. In a step 202, the start takes place of a charging process of battery pack 10. In a step 204, for each run through a different battery cell and a different channel of the input filter is selected. Following this, in a step 206 the measurement of voltage $U_1, \ldots, _n (t_1)$ takes place at a first time $t_1$. In addition, in a step 208 one of the switches $S_1, \ldots, _5$ is selected and at least briefly closed. In a following step 210, the relevant switch $S_1, \ldots, _5$ is opened again and the time measuring unit, or a timer inside monitoring unit 110, is started. Subsequently, in a step 212 there takes place a continuous measurement of the current voltage $U_1, \ldots, _n (t_2)$. In a following query step 214, a short test takes place of whether the current voltage $U_1, \ldots, _n (t_2)$ is zero volts. If this is not the case, then in a step 230 an immediate stop of the charging operation is initiated via a path 280. Otherwise, in a step 216 the relevant voltage $U_1, \ldots, _n (t_2)$ is further measured until it has again reached a fraction of from, preferably, 0.1 to 0.9 of the original voltage $U_1, \ldots, _n (t_1)$. In a subsequent query step 218, another short test takes place of whether voltage $U_1, \ldots, _n (t_2)$ is constantly rising. If this is not the case, then the immediate stopping of the charging operation again takes place in step 230, via a path 282. However, if voltage $U_1, \ldots, _n (t_2)$ is constantly increasing, then (step 220) the time measuring unit is stopped and the relevant rise time $T_{An\ 1}, \ldots, _n$ can be calculated from the difference between the second time $t_2$ at the stopping of the time measurement and the first time $t_1$. For the number n equal to one (n=1), here it may be necessary to further correct time $t_{An\ 1}$ by a numerical correction factor.

In a query step 222, there takes place a test of whether the number of n inputs has been run through, i.e. whether all inputs with battery cells have been checked. If this is not the case, then a return back to step 204 takes place via a (return) path 284. Otherwise, via a path 286, forwarding takes place to a step 224, in which (here only as an example) an absolute evaluation of all measured rise times $T_{An\ 1}, \ldots, _n$ is carried out as to whether they lie within a specified tolerance range. In a further inquiry step 226, it is checked whether all the tolerance ranges have been complied with. If this is the case, then in a step 228 the charging operation continues; otherwise, the immediate stop of charging operation takes place in step 230, via a further (return) path 288. As a result of the design, a tolerance range for an absolute evaluation of the rise times $T_{An\ 1}, \ldots, _n$ has to be dimensioned fairly large in order to properly take into account all deviations due to the aging process of the battery cells and of the active and passive electronic components.

Figure 3:
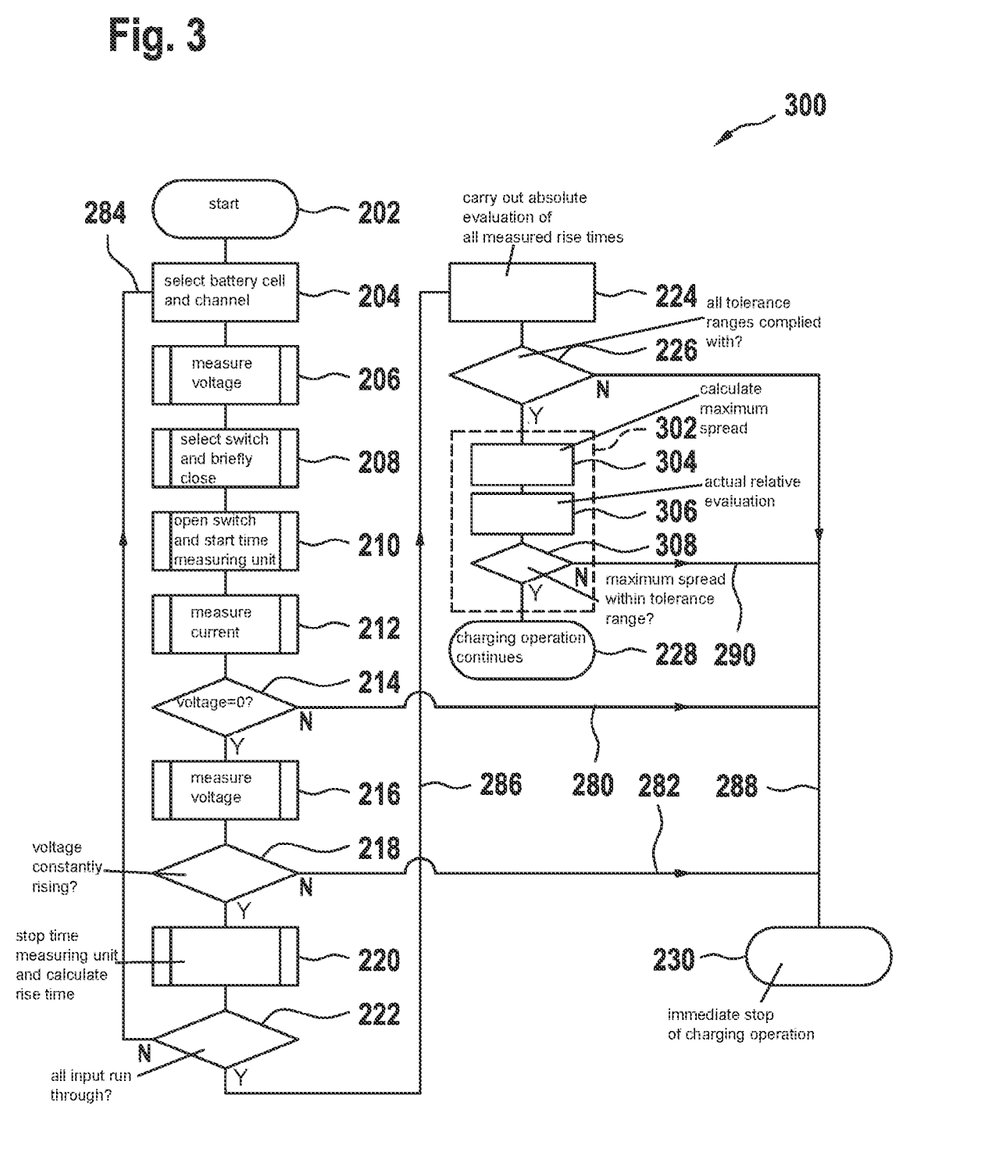
FIG. 3 shows a schematic view of an alternative algorithm for recognizing the electrical faults, in accordance with an example embodiment of the present invention.

FIG. 3 shows a further alternative algorithm for recognizing the electrical faults. Preferably, steps 202 to 230 of algorithm 200 of FIG. 2 are identical to steps 202 to 230, and to paths 282 to 288, of algorithm 300 illustrated here, so that, for the brevity of the description, reference can be made here to the statements made in the context of explaining FIG. 2.

As the only difference from algorithm 200 of FIG. 2, algorithm 300 of FIG. 3 additionally realizes a relative evaluation or assessment of the rise times $T_{An\ 1}, \ldots, _n$, which is implemented in an additionally added program part 302 (enclosed in dashed lines), including steps 304, 306, as well as a query step 308.

In a step 304 following inquiry step 226, first there takes place a calculation of a maximum spread of the rise times $T_{An\ 1},\ \ldots,\ _n$, with the aid of a difference formation between a previously ascertained minimum and maximum rise time $T_{An\ 1},\ \ldots,\ _n$. In a step 306, there then takes place the actual relative evaluation, based on a comparison of the maximum spread of rise times $T_{An\ 1},\ \ldots,\ _n$ with a specified tolerance range, or a predefined tolerance interval, preferably stored in monitoring unit 110. In a query step 308, there takes place a test of whether the maximum spread is within the tolerance range. If this is the case, then in step 228 the charging operation continues. Otherwise, in step 230 the immediate termination of the charging operation again takes place, via a further (return) path 290.

In principle, it is also possible for there to be only a relative evaluation of rise times $T_{An\ 1},\ \ldots,\ _n$, using specified tolerance ranges. However, systematic faults, such as a faulty equipping of all the capacitors with the same, incorrect capacitance value, cannot be ascertained via the relative evaluation. The advantage of the relative tolerance evaluation is first seen in the combination illustrated here with the absolute tolerance evaluation according to FIG. 2. In addition, in the case of the relative evaluation, the tolerance range can be made narrower than in the absolute evaluation. This is because it is to be assumed that identical components within input circuit 120 will always be subject to the same aging.

Figure 4:
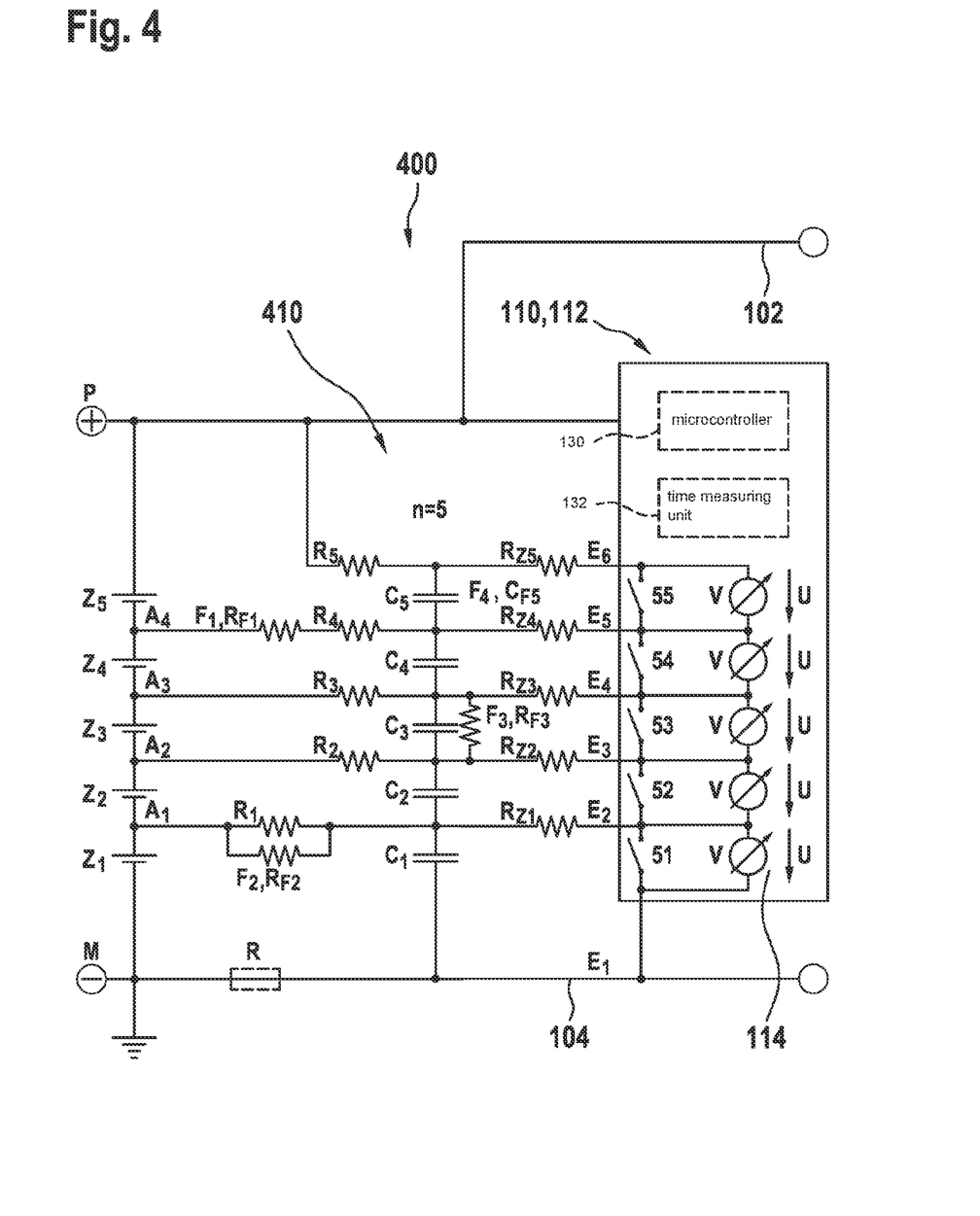
FIG. 4 shows a further specific embodiment of a battery pack according to an example embodiment of the present invention.

FIG. 4 shows a further battery pack 400 that, differing from battery pack 100 of FIG. 1, has an input circuit 410 modified with additional resistors $R_{Z1},\ \ldots,\ _5$, so that, for brevity of the description, reference is made here to the description of FIG. 1 with regard to the explanation of the further active and passive electronic components of battery pack 400. Preferably, passive input circuit 410 has a plurality of additional resistors $R_{Z1},\ \ldots,\ _5$, each connected in series with one of the resistors $R_1,\ \ldots,\ _n$, the number of additional resistors $R_{Z1},\ \ldots,\ _5$ preferably being equal to the specified number n of battery cells $Z_1,\ \ldots,\ _n$.

In the modified input circuit 410 of FIG. 4, for the number, again specified as an example, of n equal to five (n=5) battery cells $Z_1,\ \ldots,\ _5$ of battery pack 400, five of the additional resistors $R_{Z1},\ \ldots,\ _5$ are correspondingly provided as an illustration, each connected in series to the resistors $R_1,\ \ldots,\ _5$ and here each situated directly before one of the inputs $E_2,\ \ldots,\ _6$ of monitoring unit 110. The illustrative five additional resistors $R_{Z1},\ \ldots,\ _5$ are in each case smaller than, or at most equal to, the other resistors $R_1,\ \ldots,\ _5$. Preferably, a resistance value of additional resistors $R_{Z1},\ \ldots,\ _5$ is between 20% and 80% of a resistance value of resistors $R_1,\ \ldots,\ _5$. Particularly preferably, the one resistance value of additional resistors $R_{Z1},\ \ldots,\ _5$ has a resistance value that is between 20% and 50% of a resistance value of resistors $R_1,\ \ldots,\ _5$. The number of additional resistors $R_{Z1},\ \ldots,\ _5$ preferably corresponds to the number n of battery cells $Z_1,\ \ldots,\ _5$, and here the number n of resistors $R_1,\ \ldots,\ _5$ is correspondingly the number five. However, it is to be noted that the number of additional resistors $R_{Z1},\ \ldots,\ _5$ may also be unequal to the number of battery cells $Z_1,\ \ldots,\ _5$ and/or of resistors $R_1,\ \ldots,\ _5$. The additional resistors $R_{Z1},\ \ldots,\ _5$ bring about a current attenuation within input circuit 410 of monitoring unit 110.

Instead of the five electronic switches in monitoring unit 110, other active or passive electronic components may also be provided that make it possible, instead of causing a defined short-circuit, to draw a specified electrical current or to connect a defined electrical resistance. These components can be part of SCM circuit 112, but alternatively can also be integrated in passive input circuit 410, as is shown as an example in FIG. 4.

In the case of the evaluation given here of a fall-off curve of (input) voltages $U_1,\ \ldots,\ _5$ for fault recognition in input circuit for of battery pack 400, an electronic switch $S_1,\ \ldots,\ _5$ determined by the algorithm is closed over a defined time interval. At the beginning of the time interval, or immediately after the becoming effective of the closing process of the relevant switch $S_1,\ \ldots,\ _n$ at a first time $t_1$, an associated current (input) voltage $U_1,\ \ldots,\ _5 (t_1)$ is measured. After the elapsing of the time interval, or at a second time $t_2$, the relevant switch $S_1,\ \ldots,\ _5$ is opened again, and immediately after this the associated (input) voltage $U_1,\ \ldots,\ _5 (t_2)$ is measured. Following this, the ratio of $U_1,\ \ldots,\ _5 (t_2)/U_1,\ \ldots,\ _5 (t_1)$ is calculated, preferably using microcontroller 130 of monitoring unit 110. "Immediately" is used here because otherwise the associated capacitor $C_1,\ \ldots,\ _5$ would be recharged by the cell $Z_1,\ \ldots,\ _5$ allocated to it, which would cause a falsification of the measurement of the fall-off curve. The acquisition of the two times $t_1$, $t_2$ can for example take place using time measurement unit 132, controlled by microcontroller 130, of monitoring unit 110. Here, the difference between second time $t_2$ and first time $t_1$ is equal to the defined time interval.

The ratio of the two voltages $U_1,\ \ldots,\ _5 (t_2)/U_1,\ \ldots,\ _5 (t_1)$ can then in turn be evaluated absolutely and/or relatively, on the basis of a suitably specified tolerance range, corresponding to the statements made in the context of the description of FIGS. 1 to 3, and can thus be used to acquire the four electrical faults $F_1,\ \ldots,\ _4$ within input circuit 410 of battery pack 400. A particular advantage of battery pack 400, and of the evaluation of the fall-off curve, is that two mutually compensating faults can also be acquired, for example if the values of a pair $1/R_1,\ \ldots,\ _5$ and $C_1,\ \ldots\ _5$ change by the same amount, so that the product of R and C remains constant.

What is claimed is:

1. A battery pack arrangement comprising:
   a battery pack that includes a specified number of battery cells; and
   a single cell monitoring (SCM) circuit, wherein:
      the SCM circuit includes a passive input circuit using which the SCM circuit is configured to monitor for electrical faults for individual battery cells of the specified number of cells of the battery pack; and
      the monitoring is performed by measuring voltage rise times;
   wherein the battery pack arrangement includes at least one of the following four features (I)-(IV):
      (I) the measuring of the voltage rise times is performed by using at least one voltmeter to detect values of a voltage over a time period and determining an amount of time it has taken for the voltage to rise during the time period based on the detected values of the voltage during the time period and an amount of time of the time period in which the values of the voltage have been detected;
      (II) the SCM circuit is configured to, for each respective one of the individual battery cells:
         perform the monitoring of the respective individual battery cyclically with a periodicity; and
         in each cycle of the cyclical monitoring, initially create a short-circuit of a respective one of the at least one voltmeter, thereby providing a zero voltage state at the respective voltmeter, subsequently break the short-circuit, and measure a respective one of the voltage rise times beginning from the breaking of the short-circuit;
(III) the SCM circuit is configured to:
(a) ascertain a first voltage value; and
(b) subsequent to the ascertainment of the first voltage value, bridge one of the at least one voltmeter, the measuring of the voltage rise times including
(c) measuring a time it takes for the voltage to reach a predefined fraction of the ascertained first voltage value; and
(IV) the passive input circuit includes a plurality of first resistors, a plurality of capacitors, and a plurality of additional resistors that are each connected in series with one of the first resistors, a number of the additional resistors being identical to the specified number of the battery cells, and a resistance of the additional resistors being smaller than or equal to a resistance of the first resistors.

2. The battery pack arrangement as recited in claim 1, wherein the SCM circuit includes the at least one voltmeter, and includes electronic switches.

3. The battery pack arrangement as recited in claim 1, wherein the passive input circuit includes the plurality of first resistors and the plurality of capacitors.

4. The battery pack arrangement as recited in claim 1, wherein the SCM circuit is in the form of an integrated circuit.

5. The battery pack arrangement as recited in claim 1, wherein the measuring of the voltage rise times is performed by using the at least one voltmeter to detect the values of the voltage over the time period and determining the amount of time it has taken for the voltage to rise during the time period based on the detected values of the voltage during the time period and the amount of time of the time period in which the values of the voltage have been detected.

6. The battery pack arrangement as recited in claim 1, wherein the SCM circuit is configured to, for the each respective one of the individual battery cells:
perform the monitoring of the respective individual battery cyclically with the periodicity; and
in each cycle of the cyclical monitoring, initially create the short-circuit of the respective one of the at least one voltmeter, thereby providing the zero voltage state at the respective voltmeter, subsequently break the short-circuit, and measure the respective one of the voltage rise times beginning from the breaking of the short-circuit.

7. The battery pack arrangement as recited in claim 6, wherein the creation of the short-circuit and the break of the short-circuit is performed by controlling a respective switch of the respect voltmeter.

8. The battery pack arrangement as recited in claim 1, wherein the SCM circuit is configured to:
(a) ascertain the first voltage value; and
(b) subsequent to the ascertainment of the voltage value, bridge one of the at least one voltmeter, the measuring of the voltage rise times including (c) measuring a time it takes for the voltage to reach a predefined fraction of the ascertained first voltage value.

9. The battery pack arrangement as recited in claim 8, wherein the bridging is performed by control of a switch allocated to the one of the at least one voltmeter.

10. The battery pack arrangement as recited in claim 8, wherein the predefined fraction is a fraction of from 0.1 to 0.9.

11. The battery pack arrangement as recited in claim 8, wherein the SCM circuit is configured to (d) repeat steps (a) through (c) for each of the specified number of battery cells of the battery pack.

12. The battery pack arrangement as recited in claim 11, wherein the SCM circuit is configured to (e) perform an absolute and/or relative evaluation of the rise times based on a specified tolerance range.

13. The battery pack arrangement as recited in claim 12, wherein the SCM circuit is configured to:
start a charging operation of the battery pack; and
(f) execute a charging operation algorithm by which:
the charging operation of the battery pack is stopped in response to at least one of the measured rise times being outside the specified tolerance range by which the passive input circuit of the monitoring unit recognizes presence of a fault; and
otherwise the charging operation and cyclical repetition of steps (a) through (f) is continued.

14. The battery pack arrangement as recited in claim 1, wherein the passive input circuit includes the plurality of first resistors, the plurality of capacitors, and the plurality of additional resistors that are each connected in series with one of the first resistors, the number of the additional resistors being identical to the specified number of the battery cells, and the resistance of the additional resistors being smaller than or equal to the resistance of the first resistors.

15. The method as recited in claim 1, wherein the specified number is equal to one and the SCM circuit includes the at least one voltmeter and is configured to correct the rise time by a temporal correction factor when the at least one voltmeter is not connected, via an electrical resistor, to a minus pole of the battery pack.

16. A method performed by a single cell monitoring (SCM) circuit, the method comprising:
using a passive input circuit of the SCM circuit to monitor for electrical faults for individual battery cells of a specified number of cells of a battery pack, wherein the monitoring is performed by measuring voltage rise times;
wherein the method includes at least one of the following four features (I)-(IV):
(I) the measuring of the voltage rise times is performed by using at least one voltmeter to detect values of a voltage over a time period and determining an amount of time it has taken for the voltage to rise during the time period based on the detected values of the voltage during the time period and an amount of time of the time period in which the values of the voltage have been detected;
(II) the method includes, for each respective one of the individual battery cells:
performing the monitoring of the respective individual battery cyclically with a periodicity; and
in each cycle of the cyclical monitoring, initially creating a short-circuit of a respective one of the at least one voltmeter, thereby providing a zero voltage state at the respective voltmeter, subsequently breaking the short-circuit, and measuring a respective one of the voltage rise times beginning from the breaking of the short-circuit;
(III) the method includes:
(a) ascertaining a first voltage value; and
(b) subsequent to the ascertainment of the first voltage value, bridging one of the at least one voltmeter, the measuring of the voltage rise times including (c) measuring a time it takes for the voltage to reach a predefined fraction of the ascertained first voltage value; and (V) the passive input circuit includes a plurality of first resistors, a plurality of capacitors, and a plurality of additional resistors that are each connected in series with one of the first resistors, a number of the additional resistors being identical to the specified number of the battery cells, and a resistance of the additional resistors being smaller than or equal to a resistance of the first resistors.

17. The method as recited in claim 16, wherein the SCM circuit includes the at least one voltmeter.

18. The method as recited in claim 17, wherein the specified number is equal to one and the method further comprises correcting the rise time by a temporal correction factor when the at least one voltmeter is not connected, via an electrical resistor, to a minus pole of the battery pack.

19. The method as recited in claim 16, wherein the passive input circuit includes the plurality of first resistors and the plurality of capacitors.

20. The method as recited in claim 16, wherein the SCM circuit is in the form of an integrated circuit.

21. The method as recited in claim 16, wherein the measuring of the voltage rise times is performed by using the at least one voltmeter to detect the values of the voltage over the time period and determining the amount of time it has taken for the voltage to rise during the time period based on the detected values of the voltage during the time period and the amount of time of the time period in which the values of the voltage have been detected.

22. The method as recited in claim 16, wherein the method includes, for the each respective one of the individual battery cells:
performing the monitoring of the respective individual battery cyclically with the periodicity; and
in the each cycle of the cyclical monitoring, initially creating the short-circuit of the respective one of the at least one voltmeter providing the zero voltage state at the respective voltmeter, subsequently breaking the short-circuit, and measuring the respective one of the voltage rise times beginning from the breaking of the short-circuit.

23. The method as recited in claim 22, wherein the creating of the short-circuit and the breaking of the short-circuit is performed by controlling a respective switch of the respect voltmeter.

24. The method as recited in claim 16, wherein the method includes:
(a) ascertaining the first voltage value; and
(b) subsequent to the ascertainment of the voltage value, bridging the one of the at least one voltmeter, the measuring of the voltage rise times including (c) measuring the time it takes for the voltage to reach the predefined fraction of the ascertained first voltage value.

25. The method as recited in claim 24, wherein the bridging is performed by control of a switch allocated to the one of the at least one voltmeter.

26. The method as recited in claim 24, further comprising:
(d) repeating steps (a) through (c) for each of the specified number of battery cells of the battery pack.

27. The method as recited in claim 26, further comprising:
(e) performing an absolute and/or relative evaluation of the rise times based on a specified tolerance range.

28. The method as recited in claim 27, further comprising:
starting a charging operation of the battery pack; and
(f) executing a charging operation algorithm by which:
the charging operation of the battery pack is stopped in response to at least one of the measured rise times being outside the specified tolerance range by which the passive input circuit of the monitoring unit recognizes presence of a fault; and
otherwise the charging operation and cyclical repetition of steps (a) through (f) is continued.

29. The method as recited in claim 28, wherein the predefined fraction is a fraction of from 0.1 to 0.9.

30. The method as recited in claim 24, wherein the predefined fraction is a fraction of from 0.1 to 0.9.

31. The method as recited in claim 16, wherein the passive input circuit includes the plurality of first resistors, the plurality of capacitors, and the plurality of additional resistors that are each connected in series with one of the first resistors, the number of the additional resistors being identical to the specified number of the battery cells, and the resistance of the additional resistors being smaller than or equal to the resistance of the first resistors.

* * * * *